(12) United States Patent
Yoneda et al.

(10) Patent No.: US 6,831,265 B2
(45) Date of Patent: Dec. 14, 2004

(54) PHOTODETECTOR HAVING IMPROVED PHOTORESPONSITIVITY OVER A BROAD WAVELENGTH REGION

(75) Inventors: Yoshihiro Yoneda, Yamanashi (JP); Ikuo Hanawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 44 days.

(21) Appl. No.: 10/294,898

(22) Filed: Nov. 15, 2002

(65) Prior Publication Data

US 2003/0164444 A1 Sep. 4, 2003

(30) Foreign Application Priority Data

Nov. 26, 2001 (JP) ........................................ 2001-360040

(51) Int. Cl.[7] ............................................... H01J 40/14
(52) U.S. Cl. ............................... 250/214 R; 250/214.1; 257/186
(58) Field of Search ........................... 250/214.1, 214 R; 257/186

(56) References Cited

U.S. PATENT DOCUMENTS

| | | | | |
|---|---|---|---|---|
| 5,179,430 A | * | 1/1993 | Torikai | 257/186 |
| 5,569,942 A | * | 10/1996 | Kusakabe | 257/186 |
| 6,104,047 A | * | 8/2000 | Watanabe | 257/186 |
| 6,350,998 B1 | * | 2/2002 | Tsuji | 257/186 |

* cited by examiner

*Primary Examiner*—Stephone B. Allen
*Assistant Examiner*—Patrick J. Lee
(74) *Attorney, Agent, or Firm*—Armstrong, Kratz, Quintos, Hanson & Brooks, LLP

(57) ABSTRACT

A photodetector includes an optical absorption layer having a thickness d optimized with regard to a voltage applied across the optical absorption layer such that there occurs an increase of optical absorption coefficient at the wavelength of 1580 nm or longer.

9 Claims, 13 Drawing Sheets

LIGHT

PHOTODETECTOR HAVING IMPROVED PHOTORESPONSITIVITY OVER A BROAD WAVELENGTH REGION

CROSS-REFERENCE TO RELATED APPLICATION

The present application is based on Japanese priority application No. 2001-360040 filed on Nov. 26, 2001, the entire contents of which are hereby incorporated by reference.

BACKGROUND OF THE INVENTION

The present invention generally relates to optical semiconductor devices and more particularly to a high-speed photodetection device used in a high-speed and large-capacity optical fiber telecommunication system having a transmission rate of 10 Gbps or more, or 40 Gbps or more.

FIG. 1 shows a schematic cross-sectional diagram of a conventional avalanche photodiode 20 of back-illuminated type receiving an incident optical beam at a substrate and designed for flip-chip mounting. FIG. 2, on the other hand, is an enlarged cross-sectional diagram showing the circled region with an enlarged scale.

Referring to FIGS. 1 and 2, the avalanche photodiode 20 is constructed on an n-type InP substrate 1 and includes an n-type InP buffer layer 2 formed on the substrate 1, an InGaAs optical absorption layer 3 of low doping concentration formed on the buffer layer 2, and an n-type InP layer 4 is formed on the InGaAs optical absorption layer 3 with an intervening n-type InGaAsP graded layer 13 interposed therebetween, wherein the graded layer 13 fills the energy band discontinuity between the InGaAs layer 3 and the InP layer 4.

On the InP avalanche layer 4, there is provided an insulation film such as an SiN film not illustrated, and an ion implantation process of a p-type impurity element is conducted into the n-type InP layer 4 selectively through a ring-shaped window formed in such an insulation film. As a result, there is formed a guard ring 14 in the n-type InP layer 4.

Further, the SiN film is removed and another SiN film 5-1 shown in FIG. 2 is formed, and a p-type impurity element is introduced into the n-type InP layer 4 through a window formed in the SiN film 5-1. Thereby, there is formed a p-type InP region 6 inside the n-type InP layer 4 in a manner surrounded by the guard ring 14, and is also formed a multiplication region 4-1 under the p-type InP region in the n-type InP layer.

A detailed description of a p-side electrode will be made from hereon with reference to FIGS. 1 and 2.

Referring to FIGS. 1 and 2, there is formed a p-side ohmic electrode 7 of an Au/Zn alloy on the InP region 6, wherein the p-side electrode 7 has a peripheral part covered by another SiN film 5-2 provided so as to cover a ring-shaped region, in which the InP layer 4 is exposed between the SiN film 5-1 and the p-side electrode 7.

Further, the p-side ohmic electrode 7 is covered with a barrier metal layer 9 having a Ti/Pt laminated structure such that the barrier metal layer 9 makes a contact with the p-side ohmic electrode at the contact window formed in the SiN film 5-2 so as to expose the p-side ohmic electrode 7.

The barrier metal layer 9 carries thereon an Au pillar 10, and the Au pillar 10 carries thereon a solder bump 11. Thereby, the barrier metal layer 9 blocks the diffusion of Au between the p-side ohmic electrode 7 and the Au pillar 10 so as to prevent Au from diffusing to the InP region 6 through the contact window.

Further, as represented in FIG. 1, there is formed a groove exposing the n-type InP buffer layer 2 around the guard ring 14, and an n-type ohmic electrode 8 is provided in contact with the buffer layer 2 such that the n-type ohmic electrode 8 extends along the sidewall of the groove and reaches the surface of the n-type InP layer 4. Thereby, a barrier metal layer 9A similar to the barrier metal layer 9, an Au pillar 10A similar to the Au pillar 10 and a solder bump 11A similar to the solder bump 11 are formed on the n-side ohmic electrode 8 on the InP layer 4. Further, the exposed sidewall of the grove and the n-side ohmic electrode 8 are covered by an insulation film 5 formed of the SiN film 5-1 and the SiN film 5-2.

Further, a microlens 15 is formed on the bottom surface of the substrate 1 in the photodetector 20 of FIG. 1, wherein it can be seen that an antireflection coating 12 is provided further on the bottom surface of the substrate 1.

Next, the operation of the photodetector 20 of FIGS. 1–2 will be explained.

In operation, a reverse bias voltage is applied across the p-side ohmic electrode 7 and the n-side ohmic electrode 8, and a signal light having a wavelength near 1300 nm or a wavelength of 1450–1650 nm is injected into the bottom side of the substrate 1.

It should be noted that the InP crystal constituting the substrate 1 is transparent to the incident light of the foregoing wavelength, and the signal light thus injected reaches the optical absorption layer 3 without being absorbed. Thereby, the absorption of the signal light takes place exclusively in the optical absorption layer 3.

In such a photodetector, the frequency response is determined by the CR time constant given by a product of the device capacitance C and the load resistance R and further by the carrier transit time.

Thus, when an attempt is made to improve the frequency response of the photodetector in view of the fast transmission rate of 10 Gbps or 40 Gbps, it is necessary to reduce the carrier transit time in addition to the CR time constant.

Because the carrier transit time increases in proportion with the thickness of the optical absorption layer 3, it is necessary to reduce the thickness of the optical absorption layer 3 in order to achieve the improvement of frequency response by reducing the carrier transit time. On the other hand, such a decrease of thickness of the optical absorption layer 3 causes the problem of decreased quantum efficiency because of the incomplete absorption of the incident light by the optical absorption layer 3. In such a case, the responsitivity of photodetection is degraded.

In this way, frequency response and quantum efficiency (photoresponsitivity) are in the relationship of tradeoff, and it has been difficult to design a high-speed photodetector having an optimum optical absorption layer thickness.

In view of the situation noted above, the inventor of the present invention has conceived a high-speed photodetector 30 having a mirror on the n-type InP layer 4 of FIG. 1 or 2 so as to reflect back the signal light not absorbed by the optical absorption layer again to the optical absorption layer.

FIG. 3 shows the construction of the photodetector 30 noted above, wherein those parts corresponding to the parts described previously are designated by the same reference numerals and the description thereof will be omitted. It should be noted that FIG. 3 is an enlarged cross-sectional view corresponding to the part shown in FIG. 2.

Referring to FIG. 3, an SiN pattern 5-2A is formed on the p-type region 6 in the photodetector 30 as a result patterning of the SiN film 5-2, and a ring-shaped p-side electrode 7A of the Au/Zn alloy is formed in the ring-shaped opening between the SiN pattern 5-2A and the SiN film 5-2 in place of the p-side electrode 7.

On the p-side ring-shaped electrode 7A, there is formed a ring-shaped barrier metal pattern 9A of the Ti/Pt stacked structure so as to cover the ring-shaped p-side ohmic electrode 7A and so as to cover the peripheral part of the SiN pattern 5-2A as well as the peripheral part of the SiN pattern 5-2 along the ring-shaped opening. Further, the Au pillar 10 is provided on the barrier metal pattern 9A so as to make a contact with the SiN pattern 5-2A at the central opening. The Au pillar 10 thus formed carries thereon the solder bump 11 similarly to the construction of FIGS. 1 and 2.

In the photodetector 30 of FIG. 3, it should be noted that the signal light injected into the substrate 1 is reflected by a high-reflectivity mirror formed from the SiN pattern 5-2A and the Au pillar 10 and is returned to the optical absorption layer 13. Thus, it becomes possible to realize sufficient quantum efficiency in the device 30 of FIG. 3 even in the case the thickness of the optical absorption layer 3 is reduced.

In the photodetector 20 or 30 of FIGS. 1–3, the optical absorption layer 3 has an absorption edge wavelength λe of about 1.7 μm and a sufficient absorption coefficient is secured for the wavelength band of 1550 nm called C band.

On the other hand, there arises a problem in that the absorption coefficient drops rapidly in the long wavelength band called L band, which is a wavelength band longer than 1580 nm. With this, there arises a problem that substantial degradation of responsivity is inevitable in the L band even in the case the reflectivity of the mirror is improved or the wavelength-dependence of reflectivity is suppressed.

SUMMARY OF THE INVENTION

Accordingly, it is a general object of the present invention to provide a novel and useful photodetector wherein the foregoing problems are eliminated.

Another object of the present invention is to provide a photodetector having a high frequency response and high responsivity while simultaneously maintaining sufficient sensitivity for signal light of broad wavelength range used in a wavelength division multiplexing optical telecommunication system.

Another object of the present invention is to provide a high-speed optical detector having a sufficient responsivity in an L band region, in which there occurs a rapid degradation of optical absorption coefficient in an optical absorption layer.

Another object of the present invention is to provide a photodetector having an optical absorption layer, said optical absorption layer having a bandgap Eg(eV), an absorption edge wavelength λe (μM) and an optical absorption coefficient provided by:

$$\alpha(\varepsilon(\lambda)) = \alpha(\xi) \tag{A}$$

$$= \frac{0.18510^{-2} \cdot 4.3410^6}{\sqrt{0.0124}} \cdot \sqrt{k} \cdot \left[\xi(|A_i(-\xi)|)^2 + \left(\left|\frac{d}{d\xi}A_i(-\xi)\right|\right)^2\right],$$

wherein $$A_i(-\xi) = \frac{1}{\sqrt{\pi}} \int_0^\infty \cos\left[\frac{1}{3}t^3 + (-\xi)t\right]dt,$$

$A_i(-\xi)$ being an Airy function, $$\varepsilon(\lambda) = \frac{E(\lambda) - Eg}{k}, \tag{B}$$

$$E_g = \frac{1.2398472447}{n(\lambda e) \cdot \lambda e}, \quad E(\lambda) = \frac{1.2398472447}{n(\lambda) \cdot \lambda},$$

$$n(\lambda) = 1 + \left[6432.8 + \frac{2949810}{146 - \frac{1}{\lambda^2}} + \frac{25540}{41 - \frac{1}{\lambda^2}}\right] \cdot 10^{-8},$$

$$k = 0.0124\left[\frac{V}{d}\right]^{\frac{2}{3}}, \tag{C}$$

$\varepsilon(\lambda)$, $n(\lambda)$, $E(\lambda)$ being respectively a dielectric constant, a refractive index and a bandgap at the wavelength of an incident light, k being a coefficient obtained from a voltage V(V) applied to said optical absorption layer and a layer thickness d(m) of said optical absorption layer, wherein said thickness d(m) of said optical absorption layer is set with respect to said voltage V(V) applied to said optical absorption layer so as to satisfy a relationship $$10^{6} \leq V/d \leq 10^{7}. \tag{D}$$

Other objects and further features of the present invention will become apparent from the following detailed description when read in conjunction with the attached drawings.

According to the present invention, it becomes possible to expand the operational wavelength band of a photodetector having an optical absorption layer of which optical absorption coefficient is given by Equations (A)–(C), in a longer wavelength side beyond a conventional limit of 1580 nm, by setting the thickness d of the optical absorption layer with respect to an applied voltage V in a range of $10^6 \leq V/d \leq 10^7$. Thereby, it becomes possible to expand the operational wavelength band of a wavelength division multiplexing optical transmission system.

Other objects and further features of the present invention will become apparent from the following detailed description of the preferred embodiment when read in conjunction with the attached drawings.

DETAILED DESCRIPTION OF THE INVENTION

First Embodiment

Figure 4:
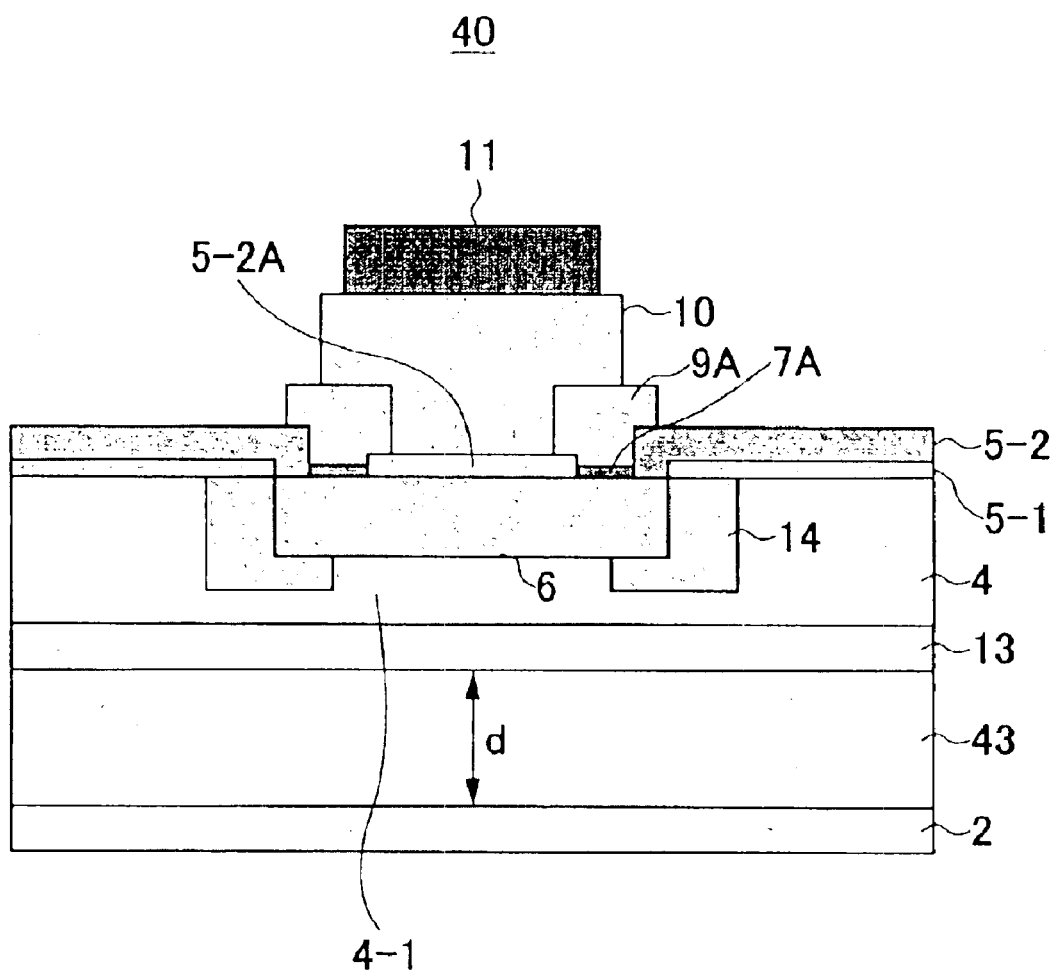
FIG. 4 is a diagram showing the construction of a back-illuminated avalanche photodiode according to a first embodiment of the present invention.

FIG. 4 shows the construction of a photodetector 40 according to a first embodiment of the present invention, wherein those parts corresponding to the parts described previously are designated by the same reference numerals and the description thereof will be omitted. It should be noted that FIG. 4 shows a part corresponding to the circled part of the avalanche photodiode of FIG. 1.

Figure 3:
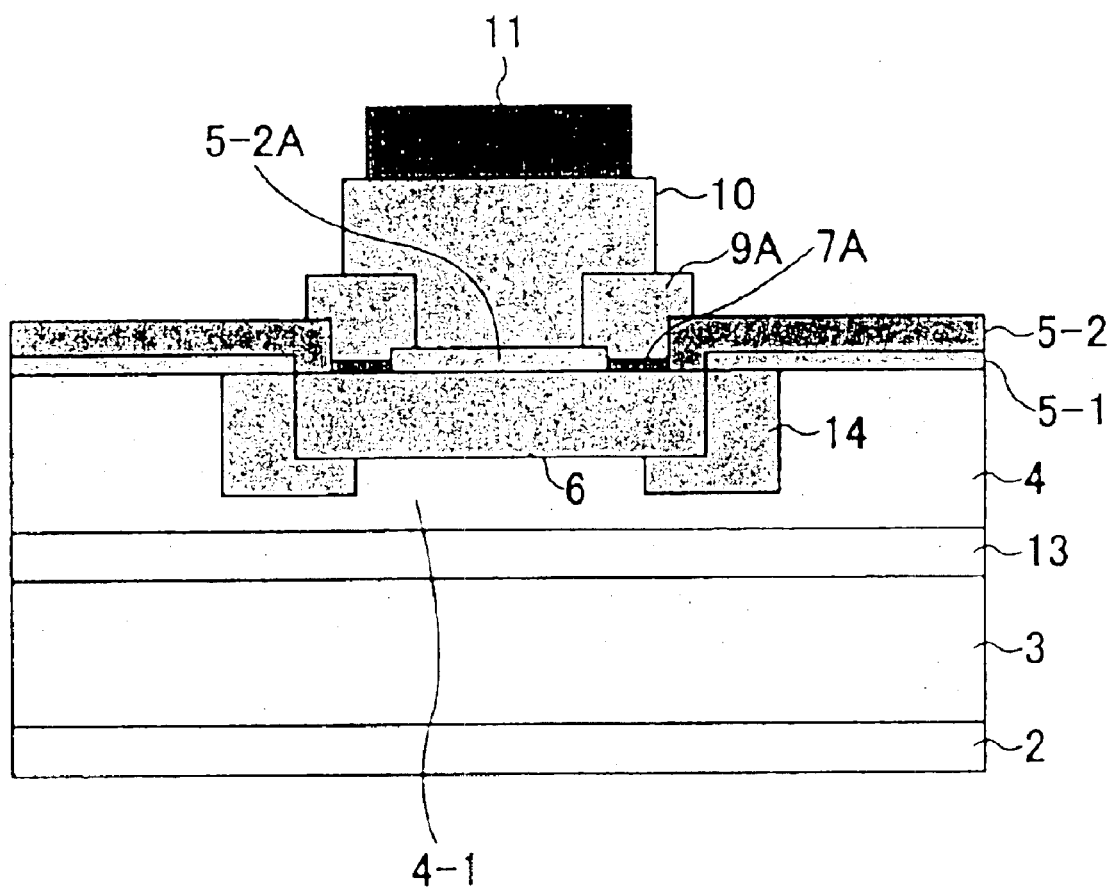
FIG. 3 is a diagram showing the construction of a back-illuminated avalanche photodiode according to a related art.

Referring to FIG. 4, the photodetector 40 has a construction similar to that of the photodiode 30 explained with reference to FIG. 3 except that there is provided a InGaAs optical absorption layer 43 having a thickness d set with respect to a voltage V applied to the optical absorption layer so as to satisfy the relationship of $V/d=2.5 \times 10^6$ [V/m].

Figure 5:
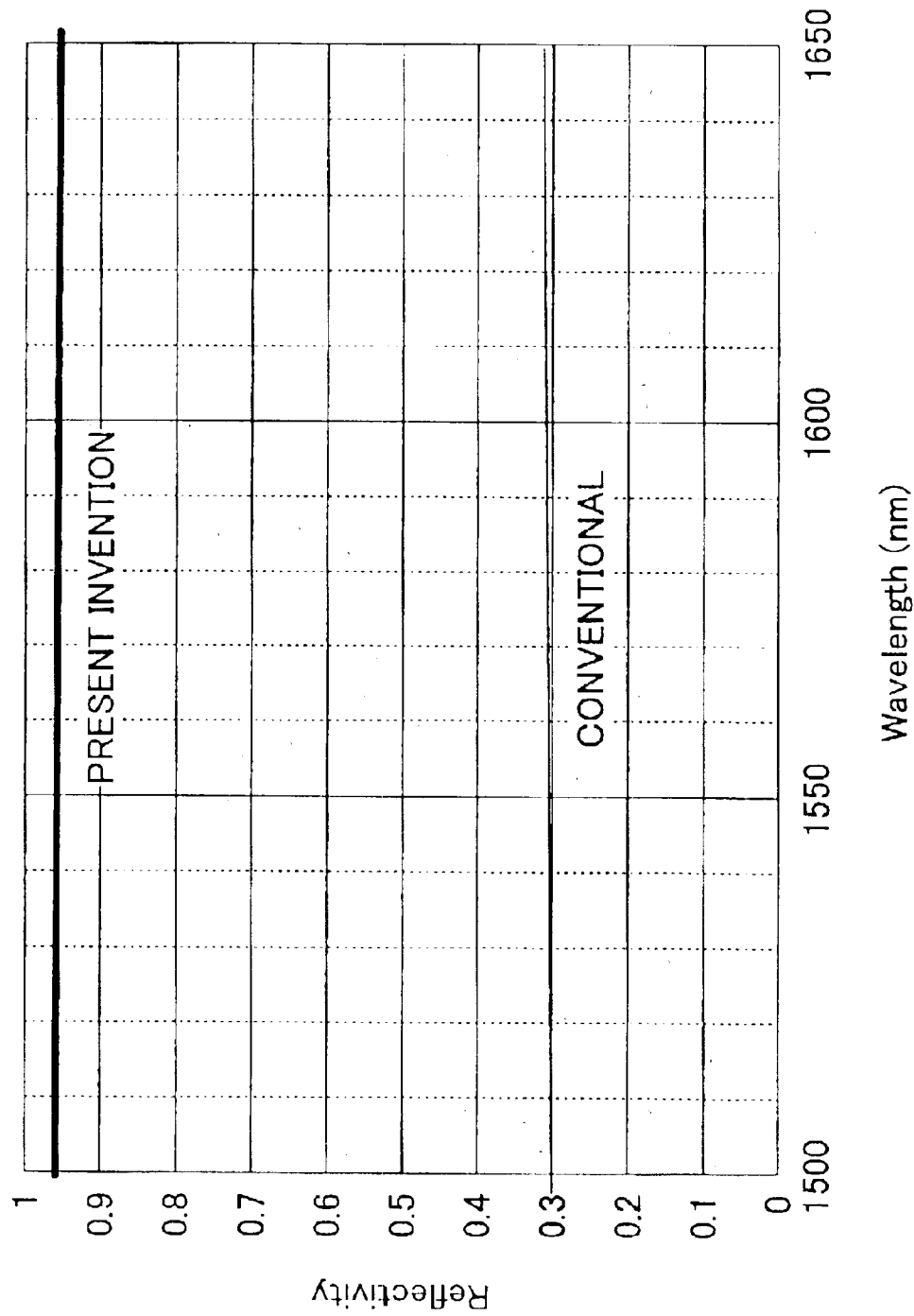
FIG. 5 is a diagram showing a reflectivity of the avalanche photodiode of FIG. 4.

FIG. 5 shows the reflectivity spectrum of the mirror formed in the photodetector 40 of FIG. 4 by the SiN pattern 5-2A and the Au pillar 10 in the wavelength band of 1500–1650 nm. It should be noted that this wavelength band includes both the C band and the L band.

Figure 2:
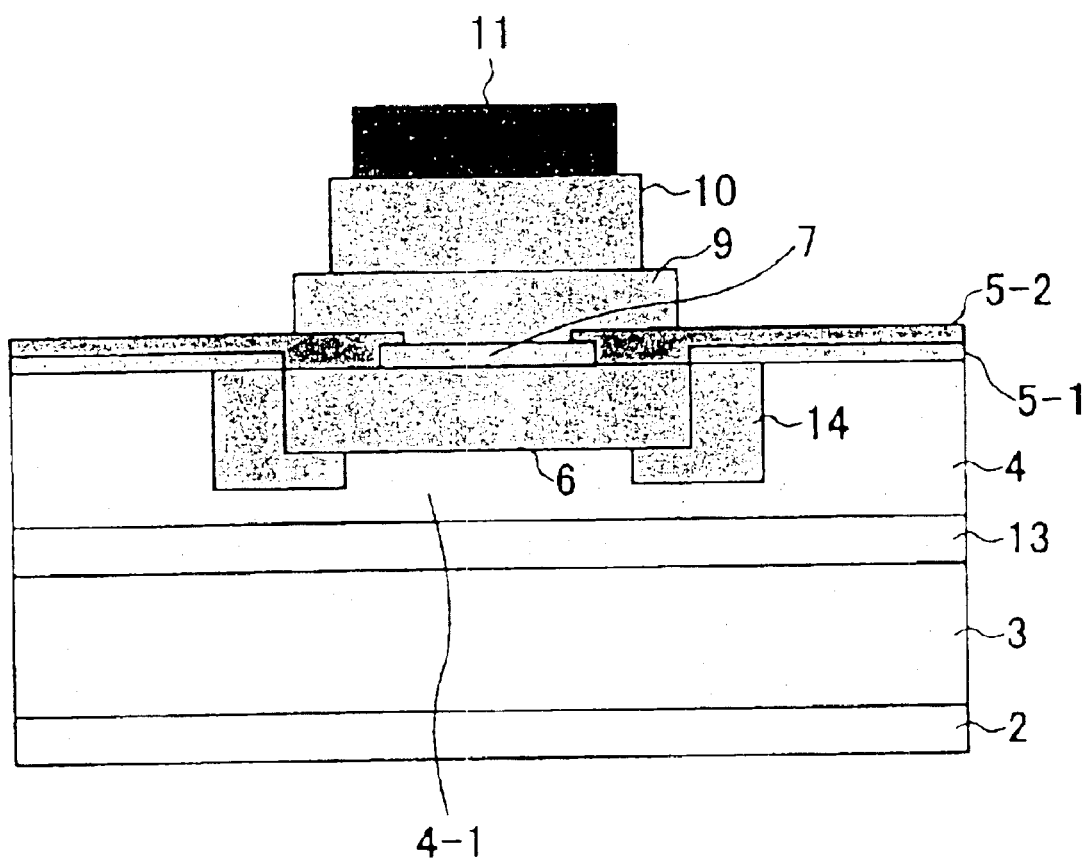
FIG. 2 is a diagram showing a part of FIG. 1 in an enlarged scale.

Referring to FIG. 5, it can be seen that a very high reflectivity of almost 100% is realized over a wide wavelength band according to the construction of FIG. 4. A similar reflectivity is obtained also in the photodetector 30 having the construction of FIG. 3. For the purpose of comparison, FIG. 5 also shows the reflectivity spectrum of the photodetector 20 of FIG. 2, wherein it can be seen that only the reflectivity of about 30% is obtained for the entire wavelength band of 1500–1650 nm.

Figure 6:
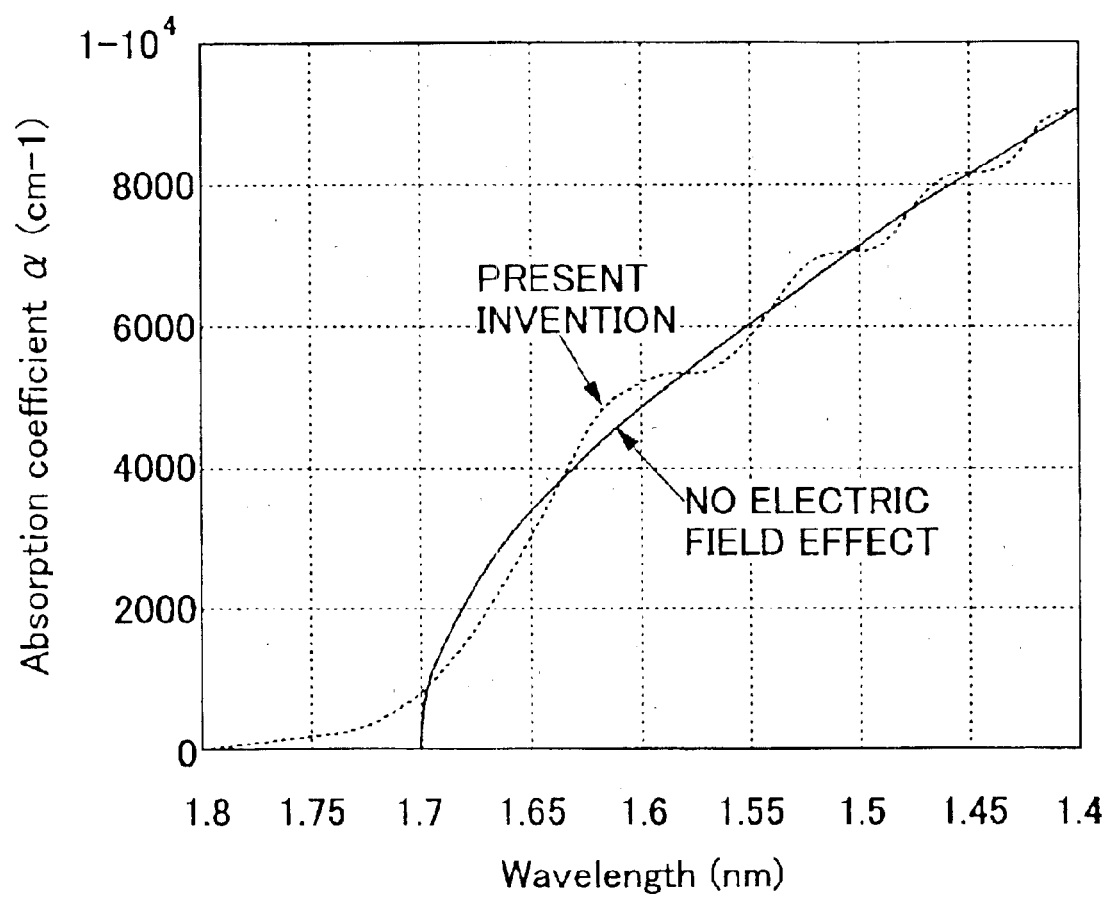
FIG. 6 is a diagram showing an optical absorption characteristic of an optical absorption layer used in the avalanche photodiode of FIG. 4 in comparison with a conventional characteristic.

FIG. 6 shows the absorption coefficient of the InGaAs optical absorption layer 43 for the case the thickness d of the optical absorption layer 43 is set with respect to the application voltage V to the optical absorption layer 43 so as to satisfy the relationship of $V/d=2.5 \times 10^6$ [V/m] in the photodetector 40 of FIG. 4, in comparison with the absorption coefficient of the InGaAs layer in which there is no electric field absorption effect.

Referring to FIG. 6, it can be seen that the optical absorption coefficient $\alpha$ of the optical absorption layer 43 "oscillates" with wavelength in the photodetector 40 because of the effect of the electric field E (=V/d) induced in the optical absorption layer 43, and that a value of the optical absorption coefficient $\alpha$ exceeding the optical absorption coefficient of the conventional device is obtained at the wavelength near 1.6 μm, provided that the electric field E is set so as to satisfy the relationship noted before.

Figure 7:
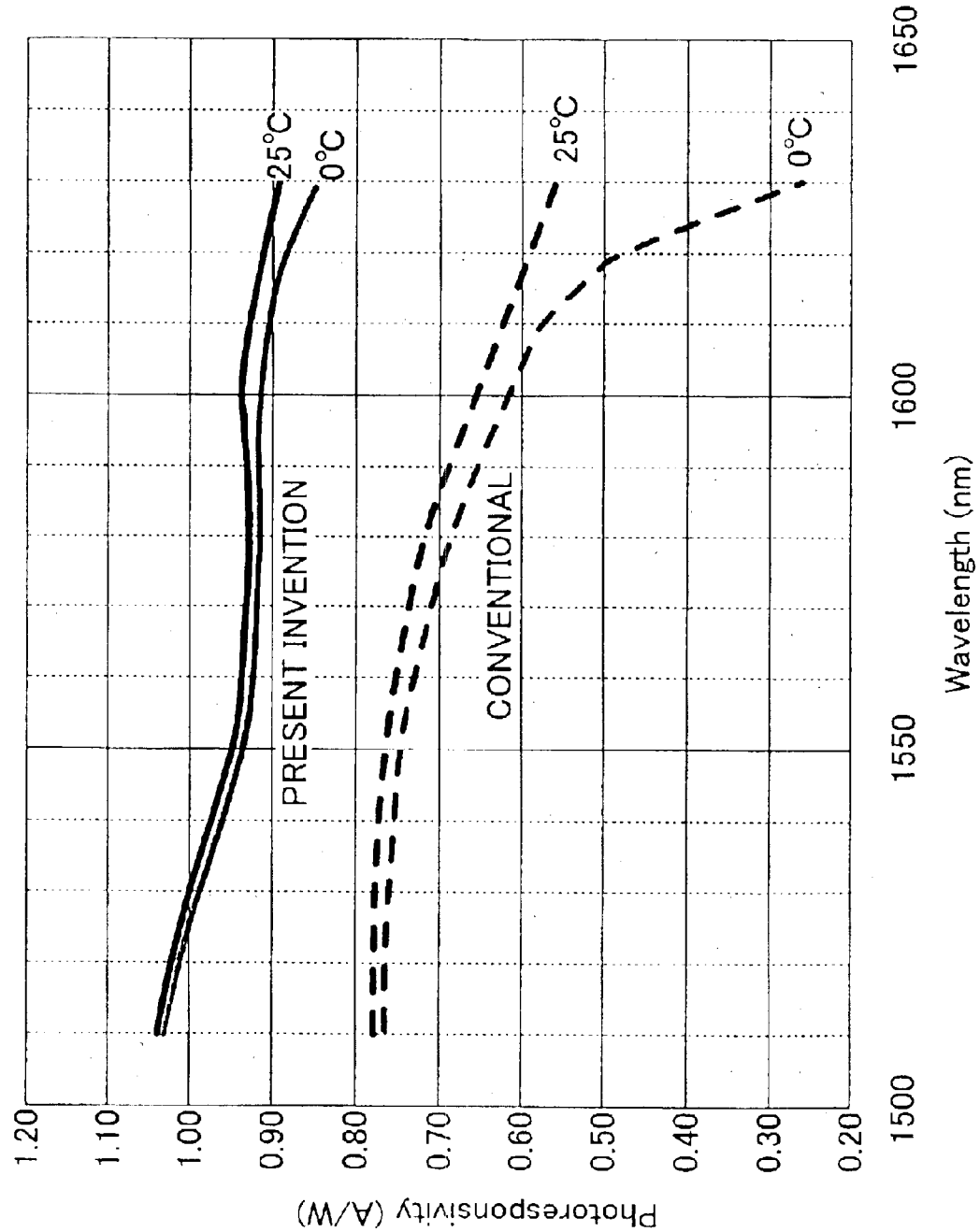
FIG. 7 is a diagram showing the photoresponsitivity of the avalanche photodiode of FIG. 4.

FIG. 7 shows the photoresponsitivity of the photodetector 40 for the wavelength of 1510–1630 nm. For the sake of comparison, FIG. 7 also shows the photoresponsitivity of the photodetector 20 of FIG. 1.

Referring to FIG. 7, it can be seen that there is a remarkable improvement of photoresponsitivity in the photodetector 40 in the wavelength of 1510–1630 nm, which is used in a wavelength division multiplex optical telecommunication system. Particularly, it can be seen that the problem of sharp degradation of photoresponsitivity at the wavelength longer than 1580 nm, as observed in the photodetector 20, is effectively eliminated in the photodetector 40 of the present invention.

Figure 8:
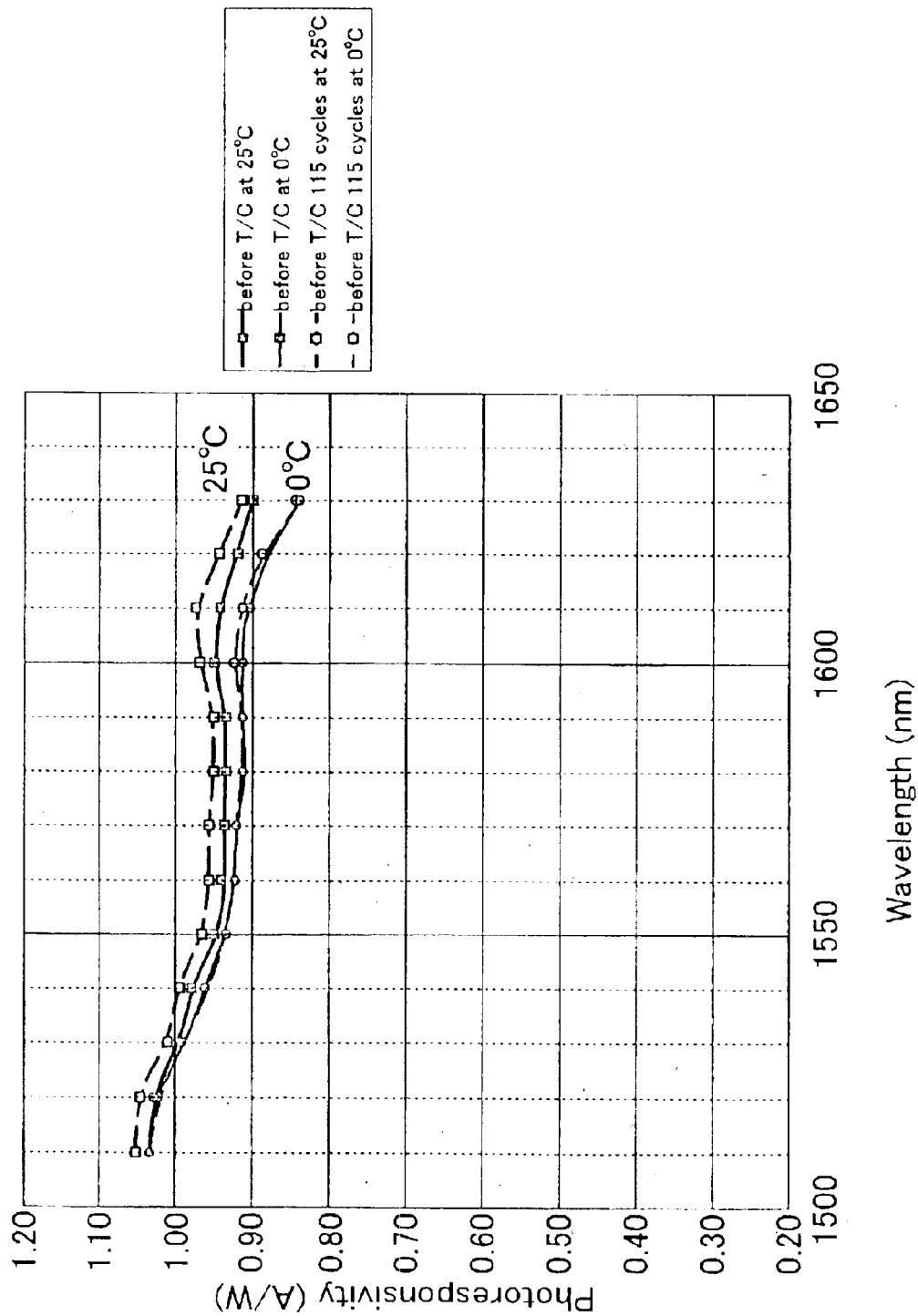
FIG. 8 is a diagram showing the result of a thermal cycling test conducted for the avalanche photodiode of FIG. 4.

FIG. 8 shows the result of thermal cycle test conducted to the photodetector 40 of FIG. 4 in a temperature range of −40–85° C. In the experiment of FIG. 8, it should be noted that 115 temperature cycles are applied to the photodetector 40.

Referring to FIG. 8, it can be seen that there is no substantial change of photoresponsitivity for the photodetector 40 even after such temperature cycles. The result of FIG. 8 shows that the photodetector 40 has excellent reliability.

Figure 9:
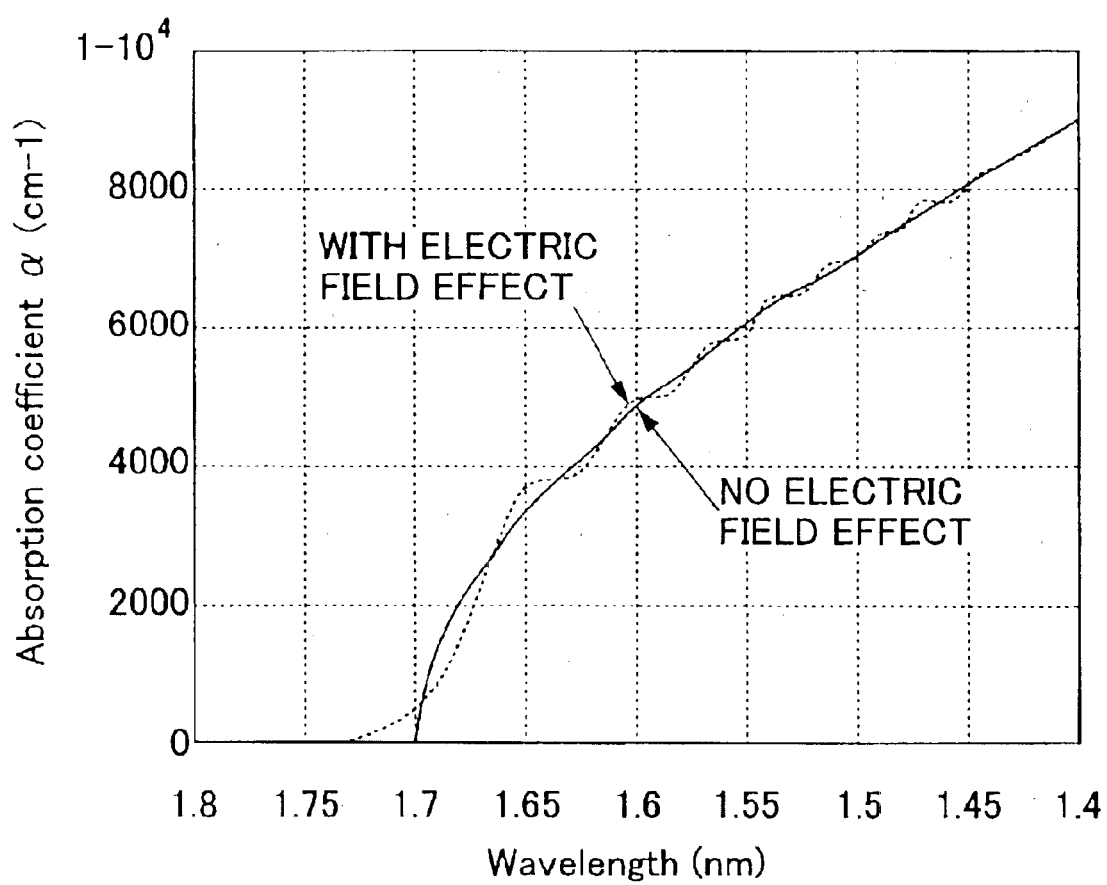
FIG. 9 is a diagram explaining a lower limit of the electric field induced in the optical absorption layer in the avalanche photodiode of FIG. 4.

FIG. 9 shows the wavelength-dependence of the optical absorption coefficient $\alpha$ of the optical absorption layer 43 for the case the electric field E applied to the photodetector 40 of FIG. 4 is set to $0.9 \times 10^6$ V/m.

Referring to FIG. 9, it can be seen that the amplitude of variation of the optical absorption coefficient $\alpha$ observed in FIG. 6 is reduced significantly when the electric field strength V/d is set less than $10^6$ V/m, and the effect of increasing the optical absorption coefficient in the long wavelength band has more or less vanished.

Figure 10:
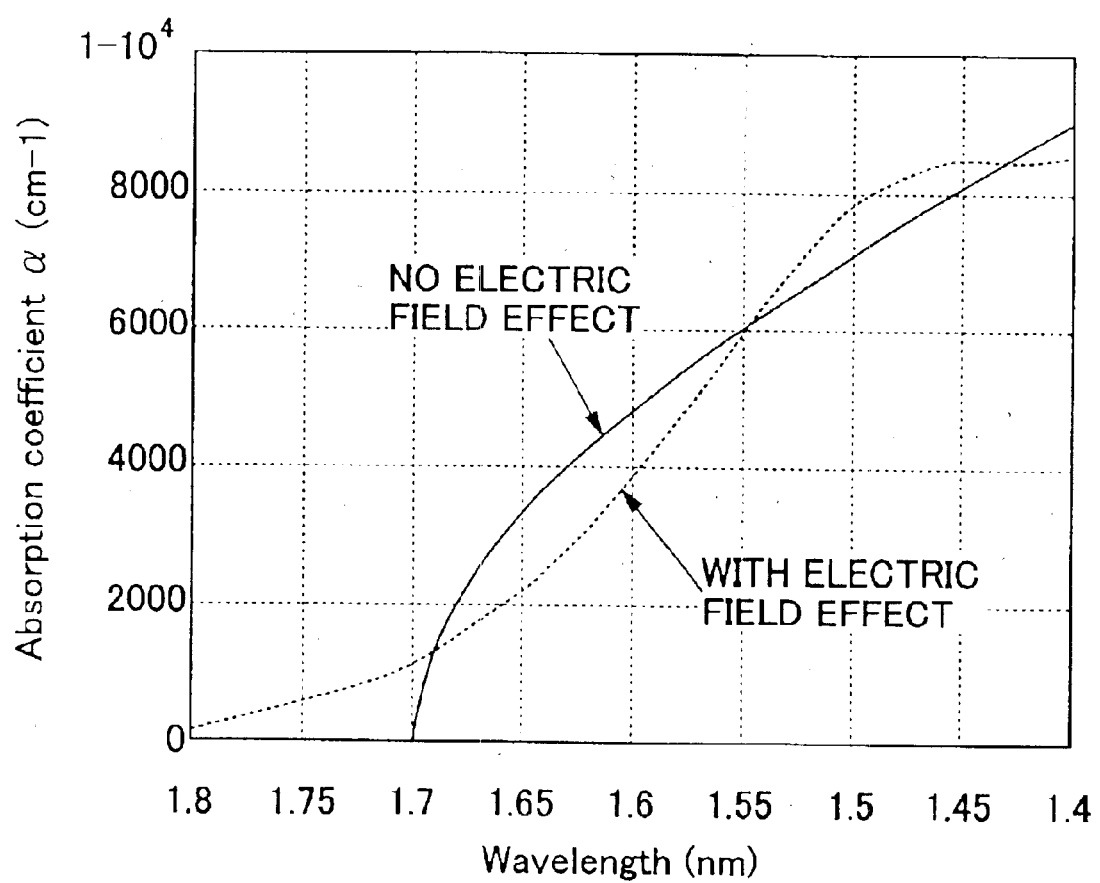
FIG. 10 is a diagram explaining an upper limit of the electric field induced in the optical absorption layer in the avalanche photodiode of FIG. 4.

FIG. 10 shows the wavelength-dependence of the optical absorption coefficient $\alpha$ of the optical absorption layer 43 for the case the electric field E applied to the optical absorption layer 43 of the photodetector 40 is set to $1.1 \times 10^7$ V/m.

Referring to FIG. 10, it can be seen that the optical absorption coefficient $\alpha$ is reduced when the electric field strength V/d in the optical absorption layer is set more than $10^7$ V/m and an undesirable result occurs.

From the foregoing results, it is concluded that the thickness d of the optical absorption layer 43 should be set such that the electric field strength V/d in the optical absorption layer 43 falls in the range of $10^6 \leq V/d \leq 10^7$. Alternatively, it is desirable to control the drive voltage applied across the ohmic electrodes 7 and 8 (see FIG. 1) such that the electric field strength in the optical absorption layer falls in the foregoing range.

Second Embodiment

Figure 11:
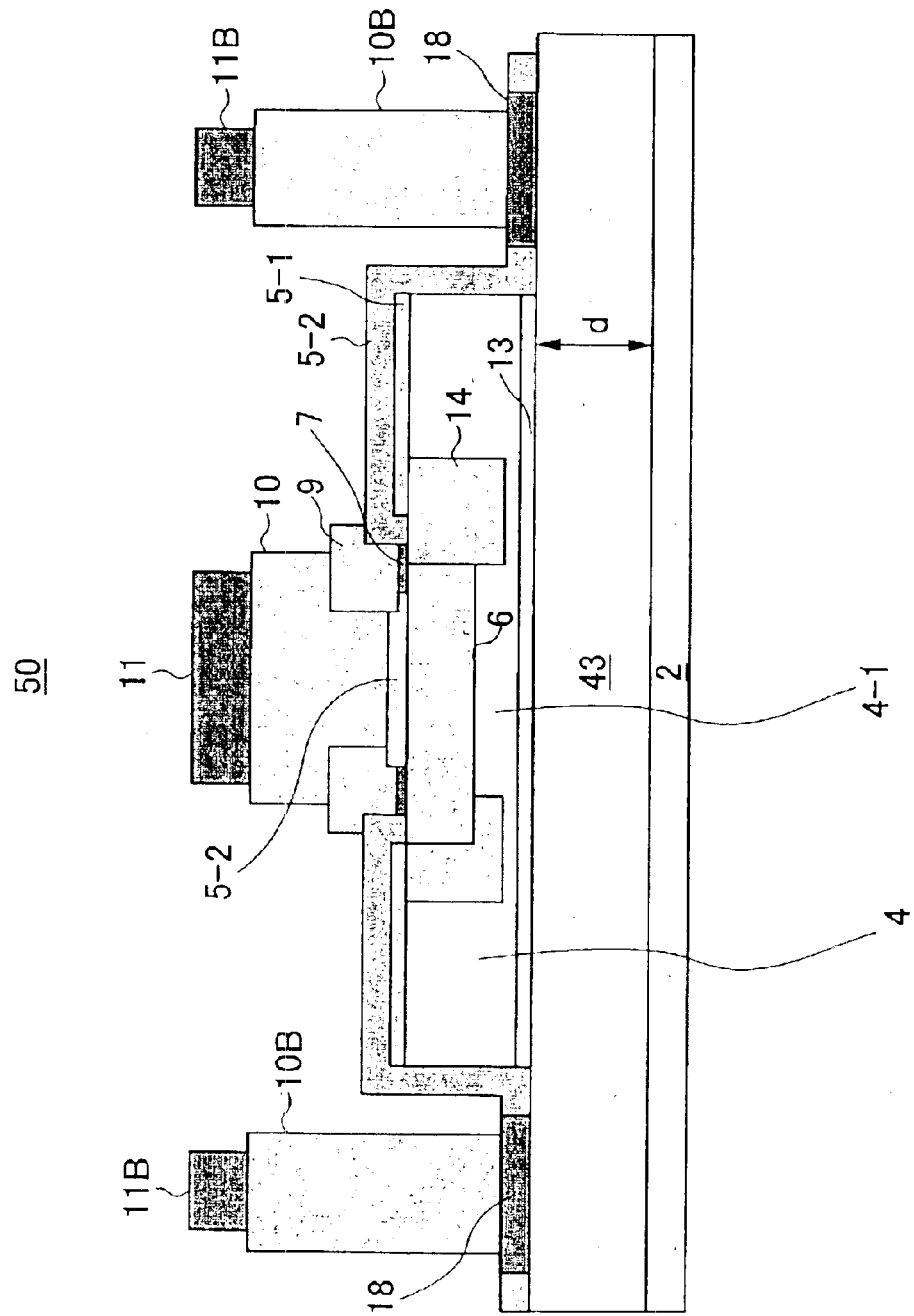
FIG. 11 is a diagram showing the construction of a back-illuminated avalanche photodiode according to a second embodiment of the present invention.

FIG. 11 shows a part of a photodetector 50 according to a second embodiment of the present invention, wherein those parts corresponding to the parts described previously are designated by the same reference numerals and the description thereof will be omitted. It should be noted that the structure of FIG. 11 corresponds to the part of the avalanche photodiode of FIG. 1 encircled by the broken line.

Referring to FIG. 11, the n-type InP layer 4 is subjected to an etching process so as to expose the optical absorption layer 43, and a mesa structure is formed as a result.

On the optical absorption layer 43 thus exposed, there is formed an n-side ohmic electrode 18 similar to the n-side ohmic electrode 8 and another Au pillar 10B is formed on the ohmic electrode 18 so as to reach the height identical to the height of the Au pillar 10. Further, another solder bump 11B is formed on the Au pillar 10B.

Figure 1:
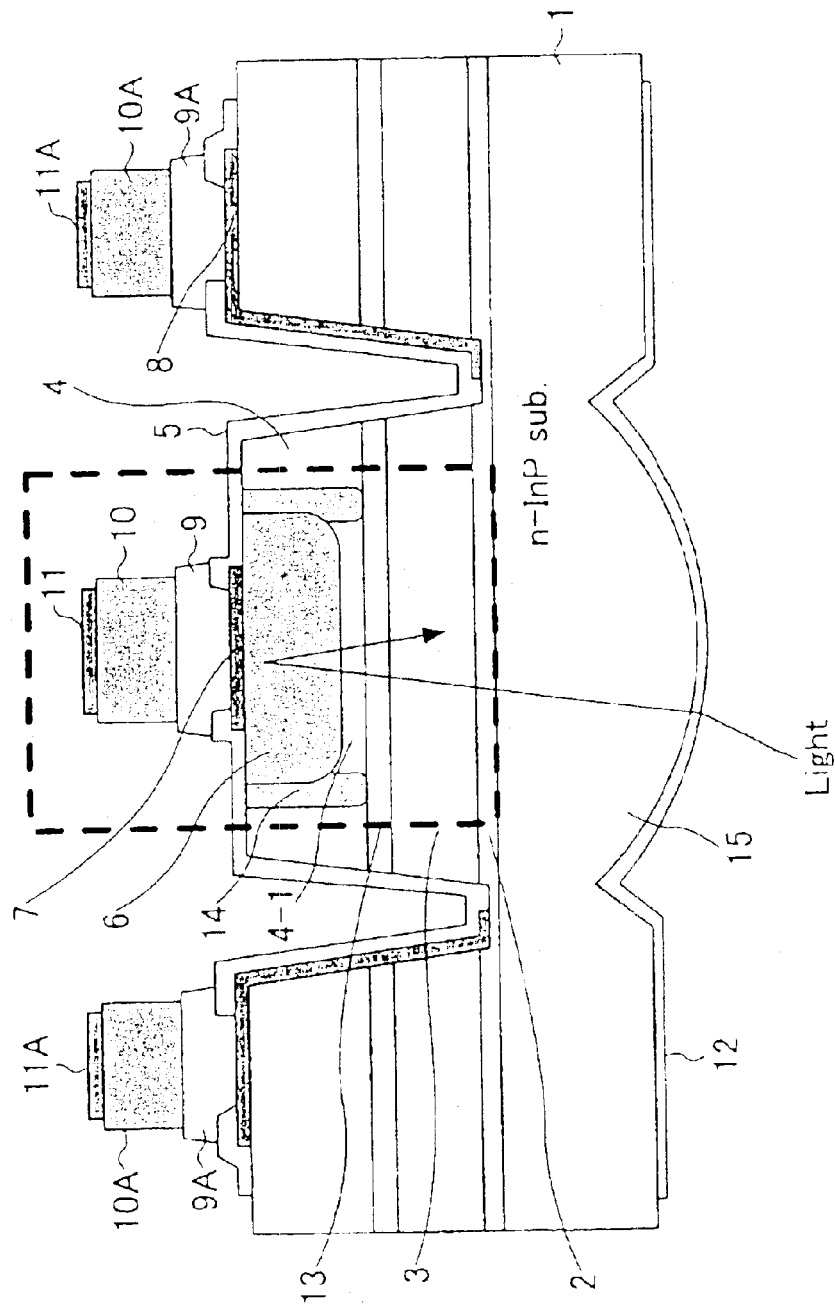
FIG. 1 is a diagram showing the construction of a conventional back-illuminated avalanche photodiode.

In the photodetector 50 of FIG. 11, it should be noted that the device has the n-side ohmic electrode 18 in addition to p-side ohmic electrode 7 and the n-side ohmic electrode 8 of FIG. 1, and thus, the photodetector 50 forms a triode.

In such a triode, it becomes possible to improve the photoresponsivity of the photodetector in the long wavelength band similarly to the case of FIGS. 7 and 8, by applying a reverse bias voltage across the ohmic electrodes 7 and 8 and further a control voltage to the ohmic electrode 18, such that the electric field in the optical absorption layer 43 falls in the foregoing range.

In the photodetector of FIG. 11, the solder bumps 11, 11A and 11B are formed at the same level, and thus, the photodetector is suitable for flip-chip mounting on a substrate.

Third Embodiment

It should be noted that the present invention is by no means limited to an avalanche photodiode but also applicable to a PIN photodiode.

Figure 12:
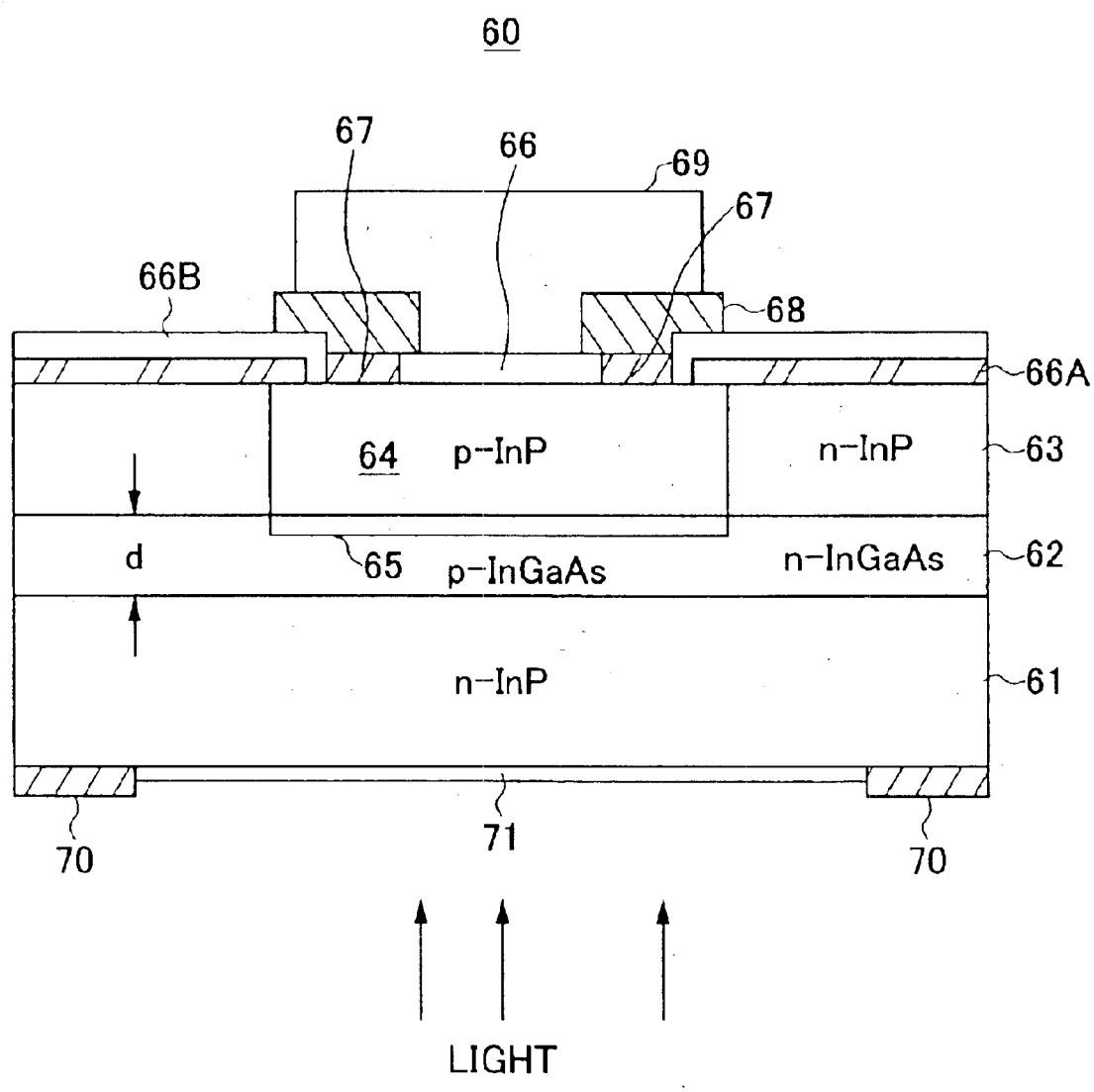
FIG. 12 is a diagram showing the construction of a back-illuminated PIN photodiode according to a third embodiment of the present invention.

FIG. 12 shows the construction of a PIN photodiode 60 of back-illuminated type receiving an optical signal through a substrate according to a third embodiment of the present invention.

Referring to FIG. 12, the PIN photodiode 60 is constructed on an n-type InP substrate 61 and includes an n-type InGaAs optical absorption layer 62 formed on the n-type InP substrate 61 and an n-type InP layer 63 formed on the n-type InGaAs optical absorption layer 62, wherein a p-type InP region 64 is formed in a part of the n-type InP layer 63. Further, a p-type InGaAs region 65 is formed in the n-type InGaAs optical absorption layer 62 in correspondence to the p-type InP region 64.

On the InP layer 63, there is formed an SiN pattern 66 corresponding to the SiN pattern 5-2A of the previous embodiment in correspondence to the p-type InP region 64, and SiN protective films 66A and 66B respectively corresponding the SiN films 5-1 and 5-2 are formed on the InP layer 63. Further, a ring-shaped p-side ohmic electrode 67 is formed in correspondence to the ring-shaped opening formed between the SiN pattern 66 and the SiN protective film 66B in contact with the p-type InP region 64, and a ring-shaped electrode 68 of the Ti/Pt structure is formed on the ring-shaped ohmic electrode 67. Further, the ring-shaped electrode 68 carries an Au pillar 69 thereon.

On the bottom principal surface of the substrate 61, there is formed a ring-shaped n-side ohmic electrode 70, and an antireflective SiN film 71 is formed in the opening of the ohmic electrode 70 so as to cover the bottom principal surface of the InP substrate 61.

In such a PIN photodiode 60, too, it is possible to realize excellent photoresponsivity in the wavelength range longer than 1580 nm by optimizing the thickness d of the optical absorption layer 62 and setting the electric field V/d to fall in the range of $10^6 \leq V/d \leq 10^7$.

Fourth Embodiment

Figure 13:
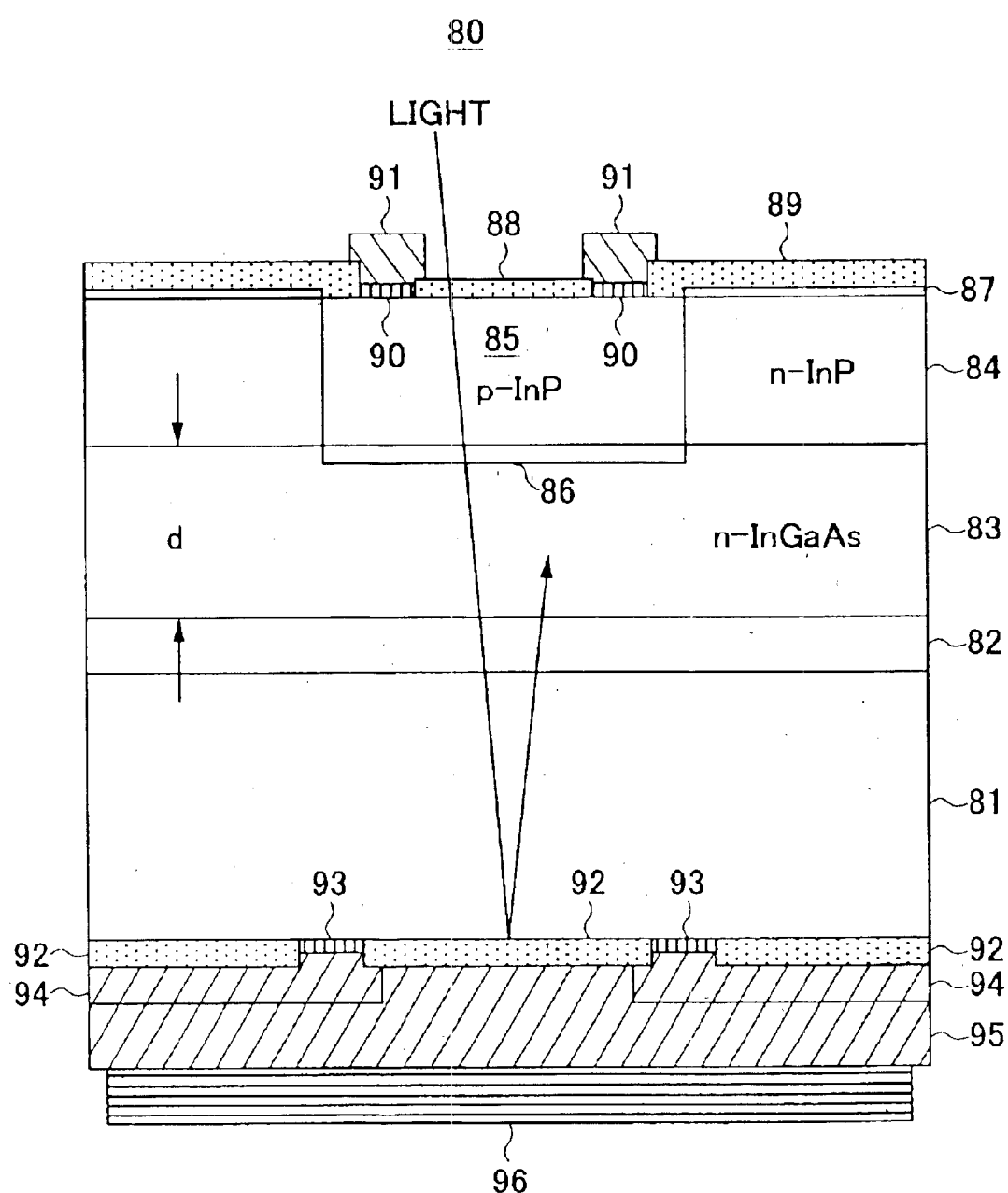
FIG. 13 is a diagram showing the construction of a front-illuminated PIN photodiode according to a fourth embodiment of the present invention.

FIG. 13 shows the construction of a front-illuminated PIN photodiode according to a fourth embodiment of the present invention.

Referring to FIG. 13, an n-type InP buffer layer 82 is formed on an n-type InP substrate 81 and an n-type InGaAs optical absorption layer 83 is formed on the buffer layer 82. Further, an n-type InP layer 84 is formed on the n-type InGaAs optical absorption layer 83 and a p-type region 86 is formed in the n-type InGaAs optical absorption layer 83 in correspondence to the p-type region 85 formed in the n-type InP layer.

The n-type InP layer 84 is covered with an SiN film 87 having an opening corresponding to the p-type region 85, and an SiN pattern 88 corresponding to the SiN pattern 5-2A is formed on the p-type region 85. Further, the SiN film 87 is covered with an SiN film 89 corresponding to the SiN film 5-2 and having an opening to form the SiN pattern 88, and a ring-shaped p-type ohmic electrode 90 is formed in the ring-shaped opening formed between the SiN pattern 88 and the SiN pattern 89 in contact with the p-type InP region 85. Further, a ring-shaped barrier electrode 91 having the Ti/Pt laminated structure is formed on the ring-shaped ohmic electrode 90.

Further, in the photodiode 80, there is formed an SiN film 92 having a ring-shaped opening on the bottom principal surface of the InP substrate 81, and an n-side ohmic electrode 93 is provided in the ring-shaped opening in contact with the InP substrate 81.

Further, a barrier electrode 94 of the Ti/Pt laminated structure is formed on the SiN film 92 and the ring-shaped ohmic electrode 93, and an Au reflector electrode 95 is formed on the barrier electrode 94 and the SiN film 92 at the central opening. Further, the Au reflector electrode 95 carries thereon a solder bump 96.

In the front-illuminated type PIN photodiode 80 of FIG. 13, it should be noted that the SiN pattern 88 functions as an antireflection coating and the light incident through the SiN pattern 88 is injected into the optical absorption layer 83. Thereby, the incident light component not absorbed by the optical absorption layer 83 is reflected by a mirror composed of the SiN film 92 and the Au reflector electrode 95 which is formed on the bottom part of the InP substrate 81 by and is returned back to the optical absorption layer 83.

In the present embodiment, too, it is possible to expand the operational wavelength band of the PIN photodiode 80 to a wavelength longer than 1580 nm by setting the thickness d of the optical absorption layer 83 so as to fall in the range of $10^6 \leq V/d \leq 10^7$.

In the present invention, it should be noted that the photodetector may be formed of any of a III–V compound system, a II–VI compound system, and a IV system.

Further, the present invention is not limited to the embodiments described heretofore, but various variations and modifications may be made without departing from the scope of the invention.

What is claimed is:

1. A photodetector having an optical absorption layer, said optical absorption layer having a bandgap Eg(eV), an absorption edge wavelength λe (μm) and an optical absorption coefficient provided by:

$$\alpha(\varepsilon(\lambda)) = \alpha(\xi) \quad\quad (A)$$

$$= \frac{0.18510^{-2} \cdot 4.3410^6}{\sqrt{0.0124}} \cdot \sqrt{k} \cdot \left[ \xi (|A_i(-\xi)|)^2 + \left( \left| \frac{d}{d\xi} A_i(-\xi) \right| \right)^2 \right],$$

wherein $$A_i(-\xi) = \frac{1}{\sqrt{\pi}} \int_0^\infty \cos\left[ \frac{1}{3}t^3 + (-\xi)t \right] dt,$$

$Ai(-\xi)$ being an Airy function, $$\varepsilon(\lambda) = \frac{E(\lambda) - Eg}{k}, \quad \text{(B)}$$

$$E_g = \frac{1.2398472447}{n(\lambda e) \cdot \lambda e}, \quad E(\lambda) = \frac{1.2398472447}{n(\lambda) \cdot \lambda},$$

$$n(\lambda) = 1 + \left[6432.8 + \frac{2949810}{146 - \frac{1}{\lambda^2}} + \frac{25540}{41 - \frac{1}{\lambda^2}}\right] \cdot 10^{-8},$$

$$k = 0.0124 \left[\frac{V}{d}\right]^{\frac{2}{3}}, \quad \text{(C)}$$

$\epsilon(\lambda)$, $n(\lambda)$, $E(\lambda)$ being respectively a dielectric constant, a refractive index and a bandgap at the wavelength of an incident light, k being a coefficient obtained from a voltage V(V) applied to said optical absorption layer and a layer thickness d(m) of said optical absorption layer, wherein said thickness d(m) of said optical absorption layer is set with respect to said voltage V(V) applied to said optical absorption layer so as to satisfy a relationship:

$$10^6 \leq V/d \leq 10^7 \quad \text{(D)}$$

wherein said photodetector includes a reflection region reflecting an incident light at a side of said optical absorption layer away from an optical surface to which a signal light is injected, said layer thickness d of said optical absorption layer being determined such that said optical absorption coefficient increases at a wavelength near 1.6 μm.

2. A photodetector as claimed in claim 1, wherein said photodetector is applied with an electric field by electrodes provided on a top surface and a bottom surface thereof.

3. A photodetector as claimed in claim 1, wherein said photodetector is applied with an electric field by a plurality of electrodes provided on a top surface thereof.

4. A photodetector as claimed in claim 1, wherein said photodetector is a back-illuminated type device.

5. A photodetector as claimed in claim 1, wherein said photodetector is a front-illuminated type device.

6. A photodetector as claimed in claim 1, wherein said photodetector is an avalanche photodiode having a multiplication region.

7. A photodetector as claimed in claim 1, wherein said photodetector is a PIN photodiode.

8. A photodetector as claimed in claim 1, wherein said photodetector is formed of a material of any of a single component system and a multicomponent system, said material being selected from any of a III–V compound system, a II–VI compound system, and a IV system.

9. A method of operating a photodetector having an optical absorption layer, said optical absorption layer having a bandgap Eg(eV), an absorption edge wavelength λe (μm), and an optical absorption coefficient provided by:

$$\alpha(\varepsilon(\lambda)) = \alpha(\xi) \quad \text{(A)}$$

$$= \frac{0.185 10^{-2} \cdot 4.34 10^6}{\sqrt{0.0124}} \cdot \sqrt{k} \cdot \left[\xi(|A_i(-\xi)|)^2 + \left(\left|\frac{d}{d\xi} A_i(-\xi)\right|\right)^2\right],$$

wherein $$A_i(-\xi) = \frac{1}{\sqrt{\pi}} \int_0^\infty \cos\left[\frac{1}{3}t^3 + (-\xi)t\right] dt,$$

$Ai(-\xi)$ being an Airy function, $$\varepsilon(\lambda) = \frac{E(\lambda) - Eg}{k}, \quad \text{(B)}$$

$$E_g = \frac{1.2398472447}{n(\lambda e) \cdot \lambda e}, \quad E(\lambda) = \frac{1.2398472447}{n(\lambda) \cdot \lambda},$$

$$n(\lambda) = 1 + \left[6432.8 + \frac{2949810}{146 - \frac{1}{\lambda^2}} + \frac{25540}{41 - \frac{1}{\lambda^2}}\right] \cdot 10^{-8},$$

$$k = 0.0124 \left[\frac{V}{d}\right]^{\frac{2}{3}}, \quad \text{(C)}$$

$\epsilon(\lambda)$, $n(\lambda)$, $E(\lambda)$ being respectively a dielectric constant, a refractive index and a bandgap at the wavelength of an incident light, k being a coefficient obtained from a voltage V(V) applied to said optical absorption layer and a layer thickness d(m) of said optical absorption layer, said method comprising the step of applying an electric field E(V/m) such that there is satisfied a relationship:

$$10^6 \leq V/d \leq 10^7. \quad \text{(D)}$$

\* \* \* \* \*